United States Patent [19]
Ueda

[11] Patent Number: 4,922,136
[45] Date of Patent: May 1, 1990

[54] MASTER SLICE INTEGRATED CIRCUIT HAVING HIGH AND LOW SPEED UNIT CELLS

[75] Inventor: Masahiro Ueda, Itami, Japan

[73] Assignee: Mitsubishi Denki Kabushiki Kaisha, Tokyo, Japan

[21] Appl. No.: 232,091

[22] Filed: Aug. 15, 1988

[30] Foreign Application Priority Data

Sep. 8, 1987 [JP] Japan ................... 62-225031

[51] Int. Cl.$^5$ ................ H03K 19/013; H03K 19/177
[52] U.S. Cl. .................... 307/465.1; 307/443; 307/455; 307/467; 307/591; 357/45
[58] Field of Search ............. 307/443, 455, 465–467, 307/590–591, 605, 303; 357/45

[56] References Cited

U.S. PATENT DOCUMENTS

| | | | |
|---|---|---|---|
| 4,438,353 | 3/1984 | Sano et al. | 307/477 |
| 4,490,630 | 12/1984 | Freeman | 307/455 |
| 4,527,079 | 7/1985 | Thompson | 307/443 X |
| 4,682,202 | 7/1987 | Tanizawa | 357/45 |
| 4,742,383 | 5/1988 | Fitzgerald | 307/465 X |
| 4,760,289 | 7/1988 | Eichelberger et al. | 307/455 |
| 4,780,846 | 10/1988 | Tanabe et al. | 307/465 X |
| 4,811,073 | 3/1989 | Kitamura et al. | 357/45 |

OTHER PUBLICATIONS

"Hardware of ACOS System 1500 Series", NEC Technical Information.
"A 50 PS 7K-Gate Masterslice Using Mixed-Cells Consisting of an NTL Gate and an LCML Macrocell" IEEE 1986 Custom Integrated Circuits Conference, pp. 580–583.
"An ECL 5000-Gate Array with 190-ps Gate Delay" IEEE Journal of Solid-State Circuits, vol. sc-21, No. 2, Apr. 1986.

Primary Examiner—David Hudspeth
Attorney, Agent, or Firm—Oblon, Spivak, McClelland, Maier & Neustadt

[57] ABSTRACT

A semiconductor integrated circuit of the master slice system is formed by arranging internal cell groups of different operating speeds in the form of arrays respectively. The internal cell groups of different operating speeds can be interconnected with each other through internal connecting areas, to reduce power consumption. The structure of each internal cell group can be optimized in accordance with its operating speed, so that the entire formation area is not much increased. Further, the formation ratio of the internal cell groups of different operating speeds is so appropriately set as to improve availability thereof.

3 Claims, 3 Drawing Sheets

MASTER SLICE INTEGRATED CIRCUIT HAVING HIGH AND LOW SPEED UNIT CELLS

BACKGROUND OF THE INVENTION

1. Field of the Invention

The present invention relates to a semiconductor integrated circuit of the master slice system.

2. Description of the Background Art

A gate array of the master slice system is manufactured in the following manner: First, internal gate cells, in which elements such as transistors and resistors for forming gates are formed with no interconnection, are regularly arranged on a silicon chip in the form of an array, in a master step. Then, the transistors, the resistors and the like are appropriately interconnected with each other by metal contacts etc., in order to implement a desired integrated circuit, in a slice step. This integrated circuit is the gate array. Such a gate array has come into wide use in recent years, since steps of manufacturing the same can be reduced as compared with a conventional semiconductor integrated circuit.

FIG. 1 is an explanatory diagram showing typical structure of a general gate array. As shown in FIG. 1, N element areas 2 are provided along the column direction in a silicon chip region 1 on a slicon chip, while M internal gate cell parts 3 are provided in each element area 2 along the row direction. An interconnection area 4 is provided around each element area 2, for connecting the internal gate cell parts 3. An input/output buffer region 5 is provided around the interconnection areas 4 for electrical matching between the internal gate cell parts 3 of the gate array and an external device. Thus, the internal gate cell parts 3 are arranged in the form of an array of M rows and N columns.

FIG. 2 is a circuit diagram showing an example of an ECL (emitter coupled logic) type internal gate cell part 3 employing bipolar transistors. Referring to FIG. 2, transistors $Q_1$ to $Q_5$ and resistors $R_1$ and $R_5$ are formed in the internal gate cell part 3 by a prescribed pattern, in a master step. Physical pattern dimensions of these elements are so set that they are common to all of such internal gate cell parts 3, in the stage of designing the master, in consideration of performance and scale of the gates to be formed. When these elements $Q_1$ to $Q_5$ and $R_1$ to $R_5$ are interconnected as shown by dotted lines, for example, an OR circuit with inputs A and B and an output Y can be formed. Another circuit such as a two-input NOR circuit or an inverter can alternatively be formed by interconnecting the elements in a different manner. Symbol $V_{BB}$ indicates reference potential and symbol $V_{EE}$ indicates source voltage.

Thus, in a gate array of the master slice system, an integrated circuit can be manufactured in a short time, since necessary logic circuits can be formed by simply changing the manner of interconnection.

In the conventional semiconductor integrated circuit of the master slice system having the aforementioned structure, however, the degree of freedom is restricted in designing the operating speed of gates, since the elements forming the internal gate cell parts 3 are fixed in size.

In order to change the operating speed of the gates formed in the internal gate cell parts 3 as needed, spare transistors and resistors are formed in the internal gate cell parts 3. They are selected by interconnection, to make the operating speed variable. However, a gate array formed by arranging the internal gate cell parts 3 is considerably increased in area, due to formation of the spare transistors and resistors provided in the respective internal gate cell parts 3 for making the operating speed variable.

If the operating speed of the gates formed in the internal gate cell parts 3 is made variable in a small variable range, two types of gate arrays GA1 and GA2 of different operating speeds are connected as shown in FIG. 3. Referring to FIG. 3, element parts 6 and 7 are provided with various gates. The gate arrays GA1 and GA2 are connected through output buffers BF. For example, an ECL type gate array employed for a computer in practice utilizes a gate array of 1000 to 2000 gates having a gate delay time $t_{pd}$ of about 0.5 ns/gate and a gate array of 100 to 200 gates having a gate delay time $t_{pd}$ of about 0.2 ns/gate. Thus, a plurality of gate arrays are combined with each other depending on gate scales, operating speeds etc. In such structure, however, a large number of excessive input/output buffers BF are required for signal propagation from the element part 6 in the gate array GA1 to the element part 7 in the gate array GA2, to excessively increase power consumption.

SUMMARY OF THE INVENTION

A semiconductor integrated circuit according to the present invention comprises a semiconductor chip and first and second internal cell groups formed on the semiconductor chip. The first internal cell group includes a plurality of first internal cells having a first operating speed. The second internal cell group includes a plurality of second internal cells having a second operating speed which is different from the first operating speed.

Accordingly, it is an object of the present invention to provide a semiconductor integrated circuit of the master slice system, which can select the operating speed of gates to be formed, without increasing the formation area and power consumption.

These and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
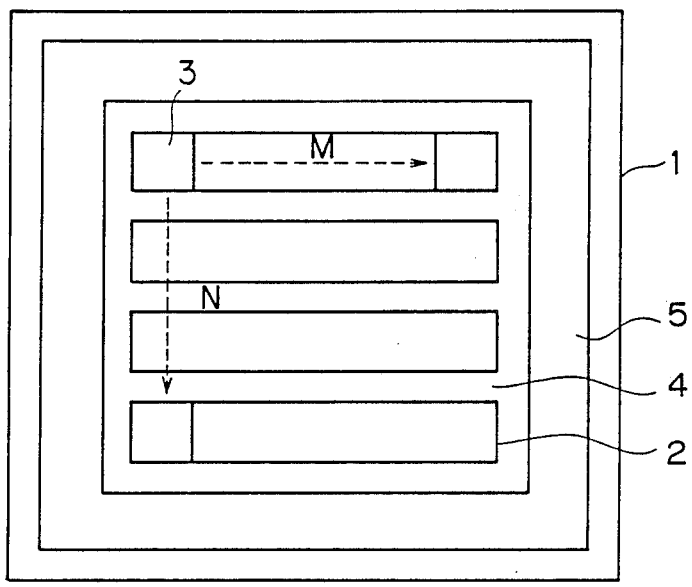
FIG. 1 is an explanatory diagram showing the structure of a conventional gate array.
Figure 2:
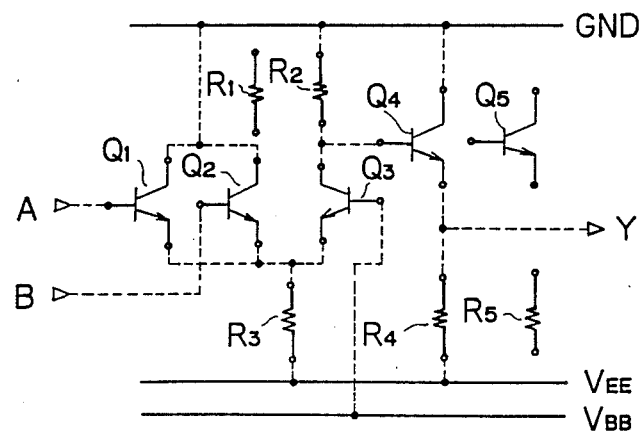
FIG. 2 is a circuit diagram showing an internal gate cell part of the gate array of FIG. 1.
Figure 3:
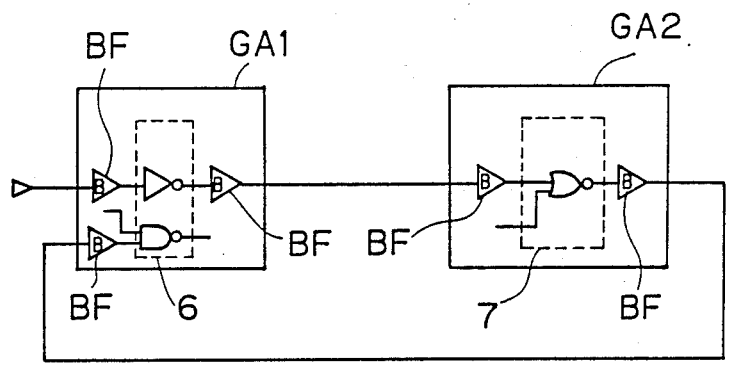
FIG. 3 is an explanatory diagram showing typical structure connecting two gate arrays.
Figure 4:
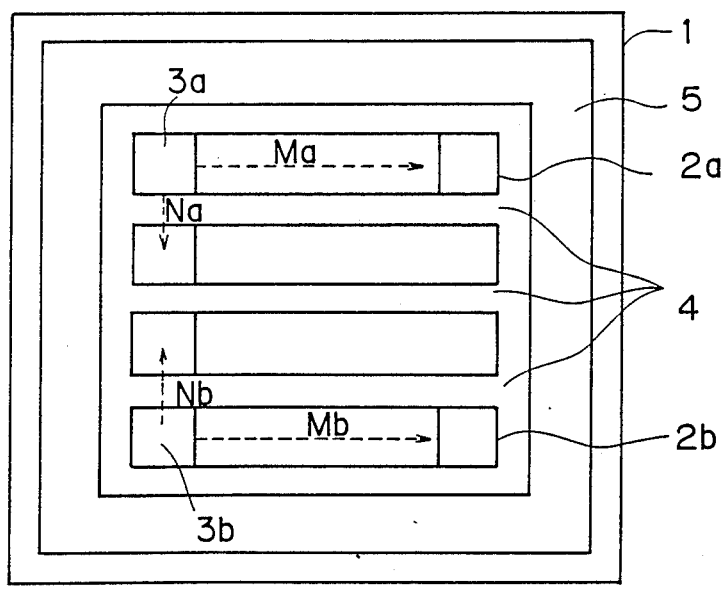
FIG. 4 is an explanatory diagram showing the structure of a gate array according to an embodiment of the present invention.

FIG. 4 is an explanatory diagram showing the structure of a gate array according to an embodiment of the present invention. Referring to FIG. 4, $N_a$ element areas 2a and $N_b$ element areas 2b are provided in a silicon chip region 1 along the column direction. Each element area 2a is provided therein with $M_a$ internal gate cell parts 3a along the row direction. The internal gate cell parts 3a are formed for a low operating speed by being relatively decreased in transistor size and operating current, for example. On the other hand, each element area 2b is provided therein with $M_b$ internal gate cell parts 3b along the row direction. The internal gate cell parts 3b are formed for a high operating speed by being relatively increased in transistor size and operating speed, for example. Common interconnection areas 4 are formed around the respective element regions 2a and 2b. An input/output buffer region 5 is formed around the interconnection areas 4.

Each of the internal gate cell parts 3a and 3b is formed by elements of a single operating speed, whereby the same can be sufficiently reduced in area by optimizing the structure of each internal gate cell part in accordance with the operating speed. Therefore, the formation area of a gate array, which is formed by setting the internal gate cell parts 3 in array, is not much increased. Further, the internal gate cell parts 3a and 3b of different operating speeds for low-speed operation and high-speed operation are provided in the same gate array, and hence they may be interconnected with each other through the interconnection areas without going through the input/output buffer region 5. Thus, power consumption is not excessively increased.

Figure 5:
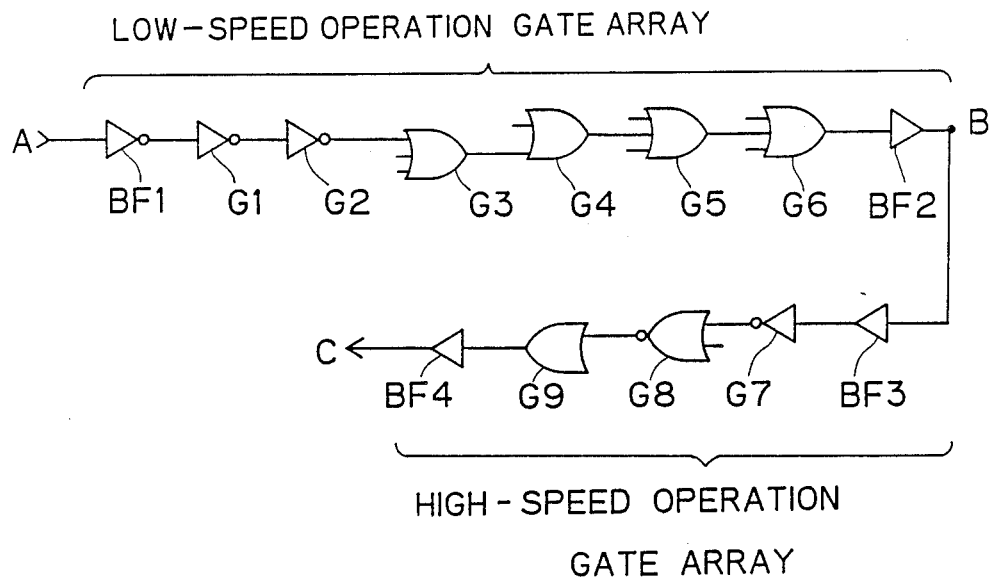
FIG. 5 is a circuit diagram showing an example of a logical path which has the combination of a low-speed operation gate array and a high-speed operation gate array.

FIG. 5 is a circuit diagram showing an example of a logical path which has the combination of a low-speed operation gate array formed by gates G1 to G6 and buffers BF1 and BF2 and a high-speed operation gate array formed by gates G7 to G9 and buffers BF3 and BF4. For example, the propagation delay time $t_{pd}$ of each gate G1 to G6 in the low-speed operation gate array is decided by one of the following equations:

$$t_{pd(1)} = t_{di} + 0.03 \times FO + 0.06 \times Al \quad (1)$$

$$t_{pd(2)} = t_{di} + 0.02 \times FO + 0.04 \times Al \quad (2)$$

where $t_{di}$ is an intrinsic delay time, FO is a fan out number and

Al is an aluminium wiring length, form the output of the gate to the input of the next gate, in the interconnection area 4. The propagation delay time $t_{pd(1)}$ corresponds to a case 1 in which an emitter follower current $I_{EF}$ is 0.4 mA and a switching current $I_s$ is 0.6 mA, and the propagation delay time $t_{pd(2)}$ corresponds to a case 2 in which both $I_{EF}$ and $I_s$ are 0.6 mA.

On the other hand, the propagation delay time $t_{pd}$ of each gate G7 to G9 in the high-speed operation gate array is decided by one of the following equations, for example:

$$t_{pd(1)} = t_{di} + 0.01 \times FO + 0.02 \times Al \quad (3)$$

$$t_{pd(2)} = t_{di} + 0.05 \times FO + 0.01 \times Al \quad (4)$$

The propagation delay time $t_{pd(1)}$ corresponds to a case 3 in which $I_{EF}$ is 2 mA and $I_s$ is 1 mA, and the propagation elay time $t_{pd(2)}$ corresponds to a case 4 in which $I_{EF}$ is 4 mA and $I_s$ is 1 mA.

The propagation delay time $t_{pd}$ of each input buffer BF1 and BF3 is obtained through the following equation;

$$t_{pd} = t_{di} + 0.02 \times FO + 0.04 \times Al \quad (5)$$

and that of each output buffer BF2 and BF4 is obtained through the following equation:

$$t_{pd} = t_{di} + 0.005 \times FO + 0.005 \times Al \quad (6)$$

The following table 1 shows values of $t_{di}$, FO, Al, $t_{pd(1)}$ and $t_{pd(2)}$ of each gate G1 to G9 and each buffer BF1 to BF4.

TABLE 1

|  | $t_{di}$ | FO | Al | $t_{pd(1)}$ | $t_{pd(2)}$ |
|---|---|---|---|---|---|
| BF1 | 0.2 (ns) | 3 | 7.86 (nm) | 0.334 (ns) | 0.334 (ns) |
| G1 | 0.19 | 6 | 2.11 | 0.497 | 0.394 |
| G2 | 0.19 | 7 | 1.92 | 0.515 | 0.407 |
| G3 | 0.25 | 3 | 1.22 | 0.413 | 0.359 |
| G4 | 0.22 | 1 | 0.31 | 0.269 | 0.252 |
| G5 | 0.25 | 1 | 2.56 | 0.433 | 0.372 |
| G6 | 0.25 | 4 | 1.54 | 0.462 | 0.391 |
| BF2 | 0.3 | 10 | 10.0 | 0.400 | 0.400 |
| BF3 | 0.2 | 4 | 0.88 | 0.315 | 0.315 |
| G7 | 0.12 | 1 | 1.20 | 0.154 | 0.137 |
| G8 | 0.14 | 7 | 1.28 | 0.236 | 0.188 |
| G9 | 0.16 | 7 | 1.84 | 0.267 | 0.213 |
| BF4 | 0.3 | 10 | 10.0 | 0.400 | 0.400 |

A logical path between nodes A and B in FIG. 5 has a propagation delay time $t_{pd}$ of 3.323 ns in the case 1
or 2.909 ns in the case 2
and a logical path between nodes B and C has a propagation delay time $t_{pd}$ of
1.372 ns in the case 3
or 1.253 ns in the case 4.

Therefore, a logical path between the nodes A and C in FIG. 5 has the following propagation delay time $t_{pd}$:

Case A; 4.695 ns in the combination of the cases 1 and 4

Case B; 4.576 ns in the combination of the cases 1 and 4

Case C; 4.281 ns in the combination of the cases 2 and 3

Case D; 4.162 ns in the combination of the cases 2 and 4

When the logical path shown in FIG. 5 is formed by using a gate array according to the present invention, which has gate cells for low-speed operation and high-speed operation, the output buffer BF2 in the low-speed operation gate array and the input buffer BF3 in the high-speed operation gate array can be eliminated. Therefore, the propagation delay time $t_{pd}$ between the nodes A and C becomes as follows:

Case A; 3.980 ns (approximately 15%)
Case B; 3.861 ns (approximately 16%)
Case C; 3.566 ns (approximately 17%)
Case D; 3.477 ns (approximately 17%)

where values in parentheses denote a propagation speed hastening factor. Thus, the propagation speed can be increased by 15 to 17% in accordance with the embodiment of the present invention. It is evident from the above description that hastening of an operating speed can be attained by eliminating an input/output buffer, in addition to the suppression of power consumption as hereinbefore described.

It has been empirically confirmed that the internal gate cell parts 3a for low-speed operation and the internal gate cell parts 3b for high-speed operation may be in the ratio of about 10:1, in order to form a gate array which is considerably availably applied to a computer or the like.

The internal gate cell parts 3a for low-speed operation and the internal gate cell parts 3b for high-speed operation may not be identical in circuit structure to each other, but the internal gate cell parts 3b may be changed in structure to a series gate (vertical type ECL) of high speed and high function.

Further, it may be also considered to arrange internal cells, which are different from each other in function other than the operating speed, in the form of arrays respectively.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit of the master slice system, comprising:
    a semiconductor chip;
    a first internal cell group formed on said semiconductor chip, said first internal cell group including a plurality of first internal cells having a first operating speed;
    a second internal chip group formed on said semiconductor chip, said second internal cell group including a plurality of second internal cells having a second operating speed which is different from said first operating speed, wherein said first and second internal cells are arranged in the form of arrays, respectively wherein first operating speed of said first internal cells is relatively high and said second operating speed of said second internal cells is relatively low and wherein the numbers of said first internal cells and said second internal cells are in the ratio of 1:10.

2. A semiconductor integrated circuit in accordance with claim 1, further including interconnection area formed around said first internal cell group and said second internal cell group commonly to said first and second internal cell groups.

3. A semiconductor integrated circuit in accordance with claim 2, further including an input/output buffer region formed around said interconnection area.

* * * * *